United States Patent [19]
Ouchida

[11] Patent Number: 4,706,294
[45] Date of Patent: Nov. 10, 1987

[54] AUDIO CONTROL DEVICE
[75] Inventor: Kenji Ouchida, Iwaka, Japan
[73] Assignee: Alpine Electronics Inc., Japan
[21] Appl. No.: 872,674
[22] Filed: Jun. 10, 1986
[30] Foreign Application Priority Data
  Jun. 11, 1985 [JP] Japan .............................. 60-86979[U]
[51] Int. Cl.$^4$ ............................................. H03G 3/00
[52] U.S. Cl. .................................... 381/109; 455/233
[58] Field of Search ............... 455/232, 233, 353, 354, 455/355; 381/104, 107, 109, 102

[56] References Cited
U.S. PATENT DOCUMENTS 4,292,467  9/1981  Odlen et al. ......................... 455/233
4,349,779  9/1982  Ono ..................................... 381/104
4,363,934  12/1982  Scholz .
4,402,246  9/1983  Sekiguchi ............................. 84/345

FOREIGN PATENT DOCUMENTS
54-41327  10/1980  Japan .................................. 381/107

Primary Examiner—Forester W. Isen
Attorney, Agent, or Firm—Guy W. Shoup

[57] ABSTRACT

In an audio control device, in which a mode selection switch, a level regulation switch, a level display, a memory, an electronic variable resistance and a brake mechanism are connected with a processor, signals produces by actuating the switches are given to the processor, which controls the level display, etc., responding to these signals, in order to effect level display, mode display, modification of set level, electronic regulator control and brake control.

3 Claims, 8 Drawing Figures

AUDIO CONTROL DEVICE

FIELD OF THE INVENTION

This invention relates to an audio control device and in particular to an audio control device having both the advantage of a rotary type analogue regulator and that of an electronic regulator.

BACKGROUND OF THE INVENTION

As elements for regulating the volume and the tone of audio electronic apparatuses are known devices in which analogue variable resistances are disposed separately for volume, low frequency tone, high frequency tone, volume ratio between left and right speakers, volume ratio between front and rear speakers etc. for the volume and tone control, and those in which a common electronic regulator is disposed for all the modes described above.

In the former, the volume or the tone is regulated by varying the rotational angle of the knob of a corresponding analogue variable resistance or the shift thereof. On the other hand, in the latter, the levels set for each of the modes is stored in a memory, referring to which the volume, the high and low frequency tone, the balance regulation of the left and right as well as the front and rear speakers, etc. are regulated electronically, and one of the set levels (digital value), which is selected by means of a mode selection switch, is changed by means of a volume up/down key.

FIG. 6 is a scheme showing the panel construction of such a prior art audio control device (where the parts which are not pertinent to this invention are omitted); FIG. 7 is a block diagram therefor; and FIG. 8 is a scheme for explaining the working mode of that device.

On the panel PNL are mounted mode selection switches Ka~Ke, each of them having a lamp, corresponding to the volume (VOL), the low frequency tone (BAS), the high frequency tone (TRE), the balance of left and right speakers (BAL) and the volume ratio of front and rear speakers (FAD), a level display LDP indicating the level set for the selected mode, a first and a second level regulation key LDK and LUK for regulating the level set for the selected mode. Further lamps La~Le constitute a mode display part MLP.

A control center unit CNT constituted by a microcomputer includes a processor CPU and a memory MEM, as indicated in FIG. 7 and in the memory MEM the level set for each of the modes is stored. The level set for each of the modes is inputted in an electronic regulator EVT, which generates a value of resistance corresponding to the set level.

Now, when a certain mode selection switch, e.g. the mode selection switch Ka for regulating the volume is pushd so that the volume mode (VOL mode) is selected, the processor CPU lightens the lamp Ka corresponding to the switch Ka, indicating that the volume mode has been selected and at the same time reads out the set volume level L from the memory MEM, which level is indicated in the level display LDP (see FIG. 8).

In this state, the level regulation key LUK is pushed, when it is desired to increase the volume, and the level regulation key LDK is pushed, when it is desired to decrease the volume. The processor CPU changes the volume level according to the following formula:

$$L+1 \rightarrow L,$$

until the level reaches the upper limit, every time when the level regulation key LUK is pushed, and the processor CPU changes the volume level according to the following formula:

$$L-1 \rightarrow L,$$

until the level reaches the lower limit, every time when the level regulation key LDK is pushed.

In addition, parallel to the procedure described above, the processor CPU controls continuously the value of resistance for the volume regulation of the electronic regulator EVL and at the same time lightens dislay elements $L_i (i=1, 2, \ldots)$ of the level display LDP under the level corresponding to that set in the manner described above. Further, also for the low frequency tone, the high frequency tone, the balance and the fader, a desired mode is selected similarly by pushing the corresponding mode selection key Ka~Ke and after that the level regulation can be effected therefor by pushing one of the level regulation keys LDK and LUK. However, for the balance mode (BAL mode), the level regulation key LDK acts so as to increase the volume ratio of the left channel to the right channel and the level regulation key LUK acts so as to increase the volume ratio of the right channel to the left channel. Furthermor, for the fader mode (FAD mode), the level regulation key LDK acts so as to increase the volume ratio of the rear speaker to the front speaker and the level regulation key LUK acts so as to increase the volume ratio of the front speaker to the rear speaker.

As mentioned above, the electronic regulator construction has an advantage that the number of variable resistances is reduced. However, on the other hand, according to the prior art electronic regulator construction, five key switches for the mode selection and two key swtiches for the level regulation and thus too many wires connecting these key switches with the processor are necessary, what gives rise to problems concerning the reduction in size of the audio electronic devices or other design, their fabrication and their cost.

Furthermor, in the prior art electronic regulator, since the up and down regulation of the set level is effected not by the rotation or the shift of the element for the operation (knob) as for the analogue variable resistances, but by pushing the key switches, no operational feeling, which the operator can have by the analogue variable resistances, cannot be obtained, what gives rise to a problem that the operability is not good.

OBJECT OF THE INVENTION

The object of this invention is to provide an audio control device having a good operability, in which the number of elements for the operation and that of switches are reduced and the same operational feeling as that for the analogue variables resistances can be obtained.

SUMMARY OF THE INVENTION

FIG. 1 is a block diagram showing the construction of a audio control device according to this invention.

In the figure, SW indicates a switch, which includes a mode selection switch SWa generating the mode selection signal SM and a rotary type level regulation switch SWb generating a first signal SLD and a second signal SLU, every time when an element for the operation, such as a knob or a handle, rotates by a predetermined angle in the first and the second rotational direction, respectively.

CPU represents a processor and MEM indicates a memory storing the level set for each of the selected modes, both of which constitute a microcomputer.

LDP is a level display for displaying the level set for the mode selected at that time; MLP is a mode display for indicating the mode selected at that time; and EVL is an electornic regulator for producing a resistance for each of the mode corresponding to the level set at that time.

BL represents a brake mechanism which brakes the rotation of the element for the operation not shown in the figure of the switch SW.

The mode selection switch SWa, the level regulation switch SWb, the level display LDP, the mode display MLP, the memory MEM, the electronic regulator EVL and the brake mechanism BL are all connected with the processor CPU.

The signal produced by rotation or push of the element for the operation of the switch SW is received by the processor CPU and level display, mode display, modification of the set level, control of the electronic regulator and control of the brake are performed under the control of the processor CPU.

The processor CPU changes the mode, every time when the element for the operation of the switch SW is pushed and a mode selection signal SM is produced by the mode selection switch SWa and reads out the level set for the mode thus selected from the memory MEM in order to display it in the level display LDP.

In addition, the processor CPU changes the level set for the selected mode, every time when the element for the operation is rotated clockwise or counter-clockwise by a predetermined angle so that a signal SLD or SLU is generated, and at the same time makes the electronic regulator EVL produce a resistance corresponding to the level newly set in this way.

Further, the processor CPU makes the brake mechanism BL function, when the level set for the selected mode reaches a predetermined value, e.g. when the level set for the volume regulation mode is raised to the upper limit determined therefor or lowered to the lower limit and in this way lets the operator know by feeling that further rotation is insignificant.

DETAILED DESCRIPTION

Figure 2:
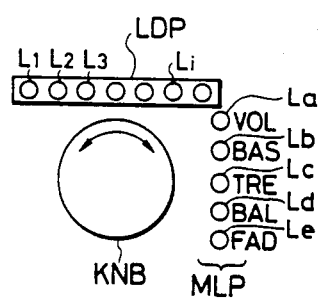
FIG. 2 is a scheme showing the panel construction.

FIG. 2 is a scheme showing the panel construction for a audio control device (only the portion which is pertinent to the audio control is indicated and the other portions are omitted) according to this invention. LDP is a level display incuding n, e.g. 10 display elements $L_i$ ($i=1, 2, \ldots$), where the level set for the mode selected at that moment is displayed. In this case, by the level display, all the display elements $L_i$ under the set level are lightened. For example, at the lowest volume level only one display element $L_1$ is lightened; at the second lowest volume level two display elements $L_1$ and $L_2$ are lightened; and so forth. In the same way, at the highest volume level all the display elements are lightened. MLP indicates a mode display including lamps La~Le. These lamps are disposed corresponding to the volume (VOL), the low frequency tone (BAS), the high frequency tone (TRE), the balance of left and right speakers (BAL) and the volume ratio of front and rear speakers (FAD), respectively, and one of them is lightened, when the corresponding mode is selected.

Figure 1:
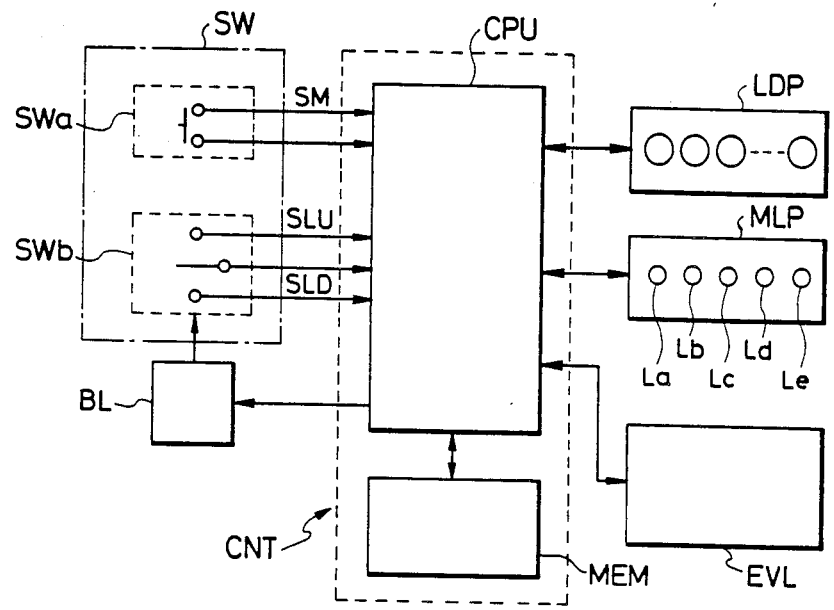
FIG. 1 is a block diagram for an audio control device according to this invention.

KNB shows the element for the operation (e.g. a knob) of the switch SW (refer to FIG. 1) and its shaft is movable in the axial direction, when it is pushed. In addition, it is rotatable endlessly both clockwise and counter-clockwise. The mode selection switch SWa having click feeling (FIG. 1) generates a pulse signal SM for the mode selection, every time when this knob KNB is pushed and changes the mode cyclically in the following order:

volume regulation mode (VOL)
→ low frequency tone regulation mode (BAS)
→ high frequency tone regulation mode (TRE)
→ left and right speaker balance regulation mode (BAL)
→ front and rear speaker volume ratio regulation mode (FAD).

Furthermore, click feeling can be obtained, every time when the knob rotates by a predetermined angle either clockwise or counter-clockwise and the level regulation switch SWb outputs a first signal (by the counter-clockwise rotation) or a second signal (by the clockwise rotation), respectively, for each click feeling.

The pulse signal SLD generated by the counter-clockwise rotation acts so as to decrease the volume for the modes VOL, BAS and TRE, to increase the volume ratio of the left channel to the right channel for the balance mode (BAL mode) and to increase the volume ratio of the rear speaker to the front speaker for the fader mode (FAD) mode. Further, the pulse signal SLU generated by the clockwise rotation acts so as to increase the volume for the modes VOL, BAS and TRE, to increase the volume ratio of the right channel to the left channel for the balance mode (BAL mode) and to increase the volume ratio of the front speaker to the rear speaker for the fader mode (FAD mode).

Figure 3:
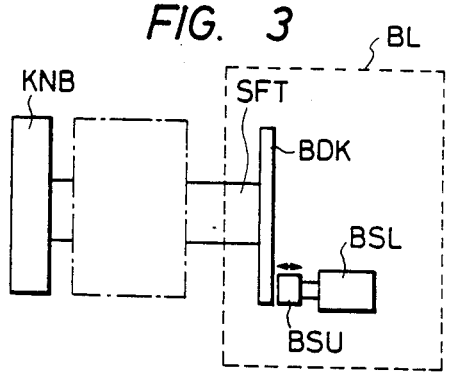
FIG. 3 is a scheme showing the outline of the brake mechanism.
Figure 6:
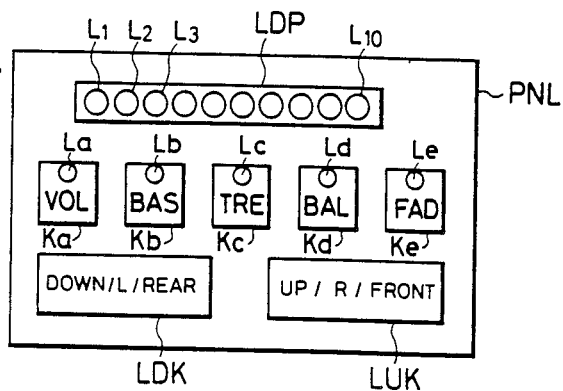
FIG. 6 represents an example of prior art panel arrangements.
Figure 7:
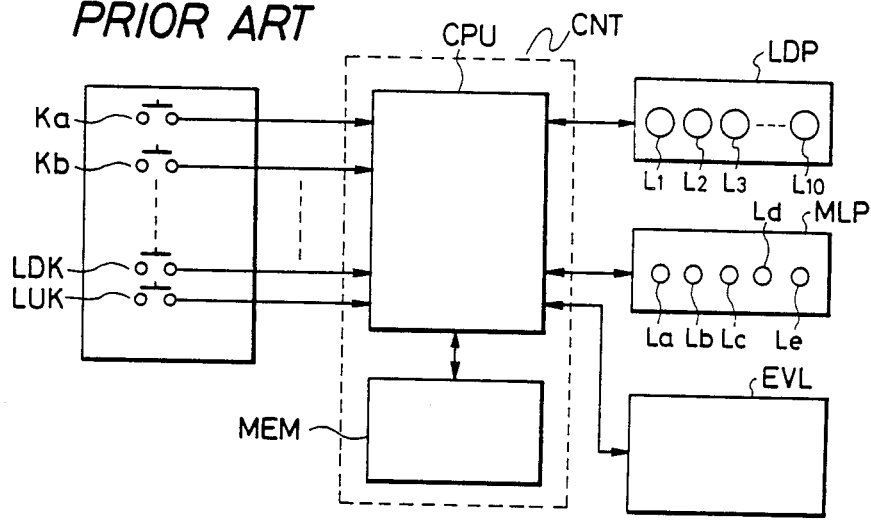
FIG. 7 is a block diagram of a prior art audio control device.
Figure 8:
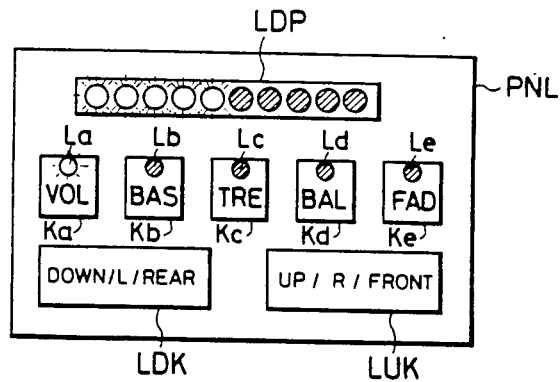
FIG. 8 is a scheme for explaining the working mode of the prior art audio control device.

FIG. 3 shows an example of brake mechanisms for braking the rotation of the element for the operation KNB. A shaft SFT is secured to the knob KNB and a brake disk BDK is disposed in one body at the other end of the shaft SFT. Further, a brake shoe BSU is mounted against the periphery of the brake disk BDK, which moves in one of the directions indicated by allows, depending on energizing/de-energizing of a brake solenoid BSL. These brake disk BDK, brake solenoid BSL and brake shoe BSU constitute the brake mechanism. The part enclosed by the mixed line in FIG. 3 indicates the part including the switches SWa and SWb.

Now, the working mode of the audio control device according to the invention will be explained, referring to the volume control.

At first, the element for the operation KNB (FIG. 2) is pushed repeatedly until the lamp La correponding to the volume regulation mode (VOL mode) is lightened.

In this case, the mode selection switch SWa (FIG. 1) produces a mode selection signal SM, every time when the element for the operation KNB is pushed, and inputs it in the processor CPU. The processor CPU counts the mode selection signal SM, every time when it is produced, and lightens one of the lamps in the mode display MLP, corresponding to the number of counted signals.

Figure 4:
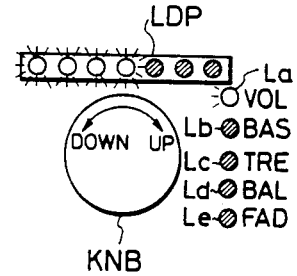
FIG. 4 is a scheme for explaining the working mode.

When the selection of the VOL mode is terminated (the lamp La is lighted), the processor CPU reads out the level set for the selected mode from the memory MEM and inputs it in the level display LDP so that the set level is displayed (refer to FIG. 4).

In this state, when it is desired to increase the volume, the element for the operation KNB is rotated clockwise. The level selection switch SWb produces a second signal SLU, every time when the element for the operation KNB rotates clockwise by a predetermined angle, and inputs it in the processor CPU.

Every time when the second signal SLU is produced, the processor CPU changes the level L set for the selected mode according to the following formula:

$$L+1 \rightarrow L.$$

At the same time the processor CPU displays the set level in the level display LDP and changes also the volume regulation resistance value of the electronic regulator EVL.

Further the processor CPU checks if the newly set level L is the upper limit of the VOL mode selected at that time or not.

If it is not, no special control is effected, but if it is the upper limit, the processor CPU energizes the brake solenoid BSL (FIG. 3) of the brake mechanism BL for a predetermined period of time and thus pushes the brake shoe BSU against the brake disk BDK in order to brake the rotation of the element for the operation KNB. In this way, the operator can know by feeling that the volume has reached the upper limit and that any further rotation is insignificant.

On the other hand, when it is desired to decrease the volume, the element for the operation KNB is rotated counter-clockwise. The level selection switch SWb produces a first signal SLD, every time when the element for the operation KNB rotates counter-clockwise by a predetermined angle, and inputs it in the processor CPU.

Every time when the first signal SLD is produced, the processor CPU changes the level L set for the selected mode according to the following formula:

$$L-1 \rightarrow L.$$

At the same time the processor CPU displays the set level in the level display LDP and changes also the volume regulation resistance value of the electronic regulator EVL.

Further the processor CPU checks if the newly set level L is the lower limit of the VOL mode selected at that time or not.

If it is not, no special control is effected, but if it is the lower limit, the processor CPU energizes the brake solenoid BSL (FIG. 3) of the brake mechanism BL for a predetermined period of time and thus pushes the brake shoe BSU against the brake disk BDK in order to brake the rotation of the element for the operation KNB. In this way, the operator can know by feeling that the volume has reached the lower limit and that any further rotation is insignificant.

Further the level, at which the brake mechanism should work, is not necessarily the upper or the lower limit. In addition, the level, at which the brake mechanism should work, can be stored in the memory MEM for each of the modes. For example, if the processor CPU can be so programmed that the brake mechanism functions, when the level set for the BAS mode, the TRE mode, the BAL mode or the FAD mode is at the middle (=5), the operator can know that the level has reached the middle value by feeling and thus the center click can be realized.

Although, in the above, the case where the switches SWa and SWb are operated in a same portion has been explained, it is also possible to construct the switches so that an element for the operation disposed coaxially inside of a first rotatable element for the operation is mounted movably in the axial direction and that each of the elements for the operation actuates a corresponding switch.

Figure 5:
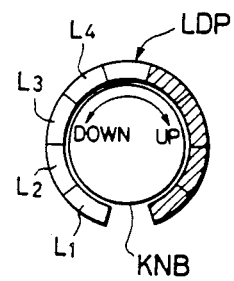
FIG. 5 represents another example of arrangements of the panel display.

Furthermore, it is also possible to dispose the level display around the element for the operation KNB, as indicated in FIG. 5. By this construction, a certain relationship is established between the rotational angle of the element for the operation and the set level and therefore the operability can be further ameliorated.

As explained above, according to this invention, since the audio control device consists of the level display for displaying the level set for each of the selected modes; the switching portion including the switch for generating the mode selection signal and the switch for outputting the first and the second signal, every time when the element for the operation rotates by a predetermined angle in the first and the second direction, respectively; the memory for storing the level set for each of the modes; the electronic regulator whose value of resistance is controlled depending on the level set for each of the modes; the brake mechanism for braking the rotation of the element for the operation; and the control part, which changes the mode, every time when the mode selection signal is produced, makes the level display display the level set for each of the selected modes, changes the level set for the selected mode and controls the electronic regulator, every time when the first or the second signal is produced, and makes the brake mechanism function, when the level set for the selected mode has reached the predetermind value, the number of elements for the operation and also wires connecting them with the processor is reduced and therefore the audio control device is advantageous in design, fabrication and cost. In addition, since the regulation for setting the level can be effected by rotating the element for the operation, the level regulation is done with the same feeling as for analogue variable resistances. That is, the audio control device according to this invention has both the advantage of the prior art electronic regulator and that of the prior art analogue variable resistance.

Further, since the mode selection and the level regulation can be effected by means of an element for the operation, it is possible to reduce the size and in addition to simplify the operation.

Still further, since the rotation of the element for the operation is braked by means of the brake mechanism, when the set level has reached the predetermined value, the operator can know by feeling that the set level has reached the predetermined value. In addition, when the level at which the brake is operated for the VOL mode is the upper or lower limit, overrun beyond the largest or smallest value can be prevented. It is also possible to obtain the center click feeling by setting the level at which the brake is operated for the other modes at the center.

The embodiments of the invention in which an exclusive property or privilege is claimed are defined as follows:

1. An audio control device comprising:
   a level display for displaying a level set for a selected mode of a plurality of modes;
   a switching portion for generating a mode selection signal for selection of a respective mode of the plurality of modes, and for generating a level signal indicating a level to be set by rotation of a switch element of said switching portion in a predetermined angle of rotation;
   an electronic regulator for generating a value corresponding to said level to be set for a selected mode by said switching portion;
   a memory for storing and recalling said generated value representing a level set for a selected mode;
   a brake mechanism for braking the rotation of said switch element when predetermined upper and lower level limits of said value for a selected mode are reached; and
   a control portion for changing to a selected mode each time the mode selection signal is generated, controlling said display to display the level previously set for the selected mode from the corresponding value stored in said memory, controlling said electronic regulator and changing the value stored in said memory for the selected mode corresponding to a level signal indicating a level currently set by rotation of said switch element, and operating said braking mechanism to brake said switch element when a predetermined upper or lower level limit for the selected mode is reached.

2. A voice control device according to claim 1, further comprising:
   a mode display for displaying the selected mode.

3. An audio control device according to claim 1, wherein said switch element is so constructed that it can be rotated unlimitedly, until it is braked by said brake mechanism.

* * * * *